United States Patent

Cathey, Jr.

Patent Number: 5,185,058
Date of Patent: * Feb. 9, 1993

[54] PROCESS FOR ETCHING SEMICONDUCTOR DEVICES

[75] Inventor: David A. Cathey, Jr., Boise, Id.

[73] Assignee: Micron Technology, Inc., Boise, Id.

[*] Notice: The portion of the term of this patent subsequent to Mar. 31, 2009 has been disclaimed.

[21] Appl. No.: 647,262

[22] Filed: Jan. 29, 1991

[51] Int. Cl.[5] .......................................... H01L 21/00
[52] U.S. Cl. .................................. 156/656; 156/643; 156/646; 156/664
[58] Field of Search ............... 156/643, 646, 656, 664, 156/655

[56] References Cited

U.S. PATENT DOCUMENTS

| | | | |
|---|---|---|---|
| 4,361,595 | 11/1982 | Kaganowicz et al. | 427/39 |
| 4,505,782 | 3/1985 | Jacob et al. | 156/665 |
| 4,659,426 | 4/1987 | Fuller et al. | 156/656 |
| 4,734,157 | 3/1988 | Carbaugh | 156/643 |
| 4,786,361 | 11/1988 | Sekine et al. | 156/664 |
| 4,838,990 | 6/1989 | Jucha et al. | 156/643 |
| 4,923,562 | 5/1990 | Jucha et al. | 156/646 |
| 5,024,722 | 6/1991 | Cathey | 156/656 |
| 5,100,505 | 3/1992 | Cathey | 204/192.32 |

Primary Examiner—Brian E. Hearn
Assistant Examiner—George Goudreau
Attorney, Agent, or Firm—Marger, Johnson, McCollom & Stolowitz

[57] ABSTRACT

The subject invention is directed to a process for etching a semiconductor device to form a predetermined etched pattern therein. The semiconductor device which is provided herein typically has a plurality of layers. At least one of these layers comprises a metal-containing material having a metal content of at least about 80% by weight. Etching the semiconductor device with an etchant material forms a predetermined etched pattern therein. This pattern includes the formation of horizontal and upright sidewalls in the etched layers which comprise the metal-containing material. Thus, each of the upright sidewalls has a profile which is either substantially vertically sloped or is positively sloped. This is the case even though the chemical etchant composition, when employed by itself to etch the above-described metal-containing layers, forms sidewall profiles which are substantially negatively sloped configuration. The etchant material employed herein comprises a chemical etchant composition and a coating composition. In one preferred form of this invention the coating composition comprises a gaseous oxide of carbon, particularly carbon monoxide or carbon dioxide, and a silicon-containing compound, respectively. The etchant material is in a substantially gas phase during the etching of the semiconductor device and deposits a protective film on the upright sidewalls of the etched semiconductor device. The silicon-containing compound typically comprises a silicon tetrahalide, preferably comprising $SiCl_4$, $SiBr_4$, or $SiF_4$. However, the most preferred compound being $SiCl_4$.

6 Claims, 1 Drawing Sheet

PROCESS FOR ETCHING SEMICONDUCTOR DEVICES

This invention relates to a process for etching semiconductor devices, and more particularly to a process for effectively and efficiently etching multi-layer semiconductor devices while maintaining intact the electrical characteristics of these devices.

It is known in the prior art that the manufacture of multi-layer semiconductor devices typically involves patterned etching using liquid or wet etching materials, or dry etching with halogens or halogen-containing compounds, of certain layers which comprise features of these devices. For example, one well known etching material is chlorine which can exist in the etching process as either chlorine gas or HCl. Chlorine etches the semiconductor isotropically, i.e., in both a lateral and vertical direction. This results in an etched feature which has a line width which is smaller than the resist image.

Etching can also be conducted in a gas phase using known techniques such as plasma etching, ion beam etching, and reactive ion etching. The use of gas plasma technology provides substantially anisotropic etching using gaseous ions, typically generated by an RF discharge. In gas plasma etching, the requisite portion of the surface to be etched is removed by a chemical reaction between the gaseous ions and the subject surface. In the anisotropic process, etching takes place primarily in the vertical direction so that feature widths substantially match the photoresist pattern widths. In U.S. Pat. No. 4,734,157 an elemental silicon-containing layer, such as a layer of polysilicon or silicide, is etched anisotropically employing a gas plasma comprising a gaseous chlorofluorocarbon, capable of supplying $CF_X$ and chlorine ions, and ammonia. Profile control of a silicon layer is controlled by the use of this etching mode.

A problem which occurs during the gas plasma etching process is profile control which can result in undercutting, i.e., forming a positively sloped sidewalls, of the semiconductor layers below the outer layer of the semiconductor device (see FIGS. 1 & 2). For example, if the metal layer is aluminum or an aluminum alloy (particularly those alloys containing copper), a gaseous chlorine or HCl etchant will readily react with the aluminum to form aluminum trichloride and will isotropically etch, and thereby undercut the aluminum layer sidewalls.

Control of this chemical reaction, and in turn control of the profile of a predominantly metal layer in a semiconductor structure, is difficult at best. Various chloro- or fluoro-hydrocarbons which form polymeric additives, such as $CCl_4$, $CHCl_3$, $CH_3Cl$, $CHF_3$, etc., have been used for depositing carbon onto the sidewall to controlling the undercutting problem. However, these deposits can foul the interior of the plasma chamber, are difficult to clean, and are toxic in nature. Silicon-based additives which are combined in the etching mixture, deposit silicon or silicon compounds on the sidewall of the plasma chamber as they are formed. These additives keep the photoresist from reticulating and flowing. $BCl_3$ is also a known halogenated additive.

If oxygen gas or certain oxygen-containing compounds are added to silicon-containing plasma, a glass is formed on the semiconductor device. Although this glass will protect the sidewalls, the free oxygen from the oxygen-containing compounds used to form the glass will also have the undesirable effect of chemically attacking the photoresist.

Therefore, a need exists for a process which prevents, in semiconductors having at least one predominantly metallic layer, the formation of upright metallic sidewalls which form a substantially negative slope during the patterned etching of the metallic layers, and which avoids the use of additives thereby avoiding the plasma chamber fouling problem.

SUMMARY OF THE INVENTION

The process of the present invention meets the above-described existing needs in semiconductors by forming upright sidewalls having profiles which are substantially vertical (see FIG. 3). In fact, if desired, the subject process can even form upright sidewalls which are positively sloped (see FIG. 4). In either of the situations depicted in FIGS. 3 and 4, the upright walls have deposited thereon silicon/oxygen-containing or silicon/-carbon-containing protective coating materials to avoid the aforementioned undercutting problem. The undercutting problem is avoided by the creation of an inorganic passivation layer which is deposited on the sidewalls and serves as a resilient coating against horizontal etching of the metal-containing layer. The level of fouling and of toxicity in the interior of the plasma etching chamber can also be substantially reduced by employing the coating materials of this invention, as compared to the use of conventional hydrocarbon additives since the inorganic deposits can be readily cleaned from the etching chamber during the plasma cleaning operation. In this way, the time between chamber cleanings can be substantially increased by employing the subject process. By employing the subject process, as described above, the respective levels of fouling and of toxicity in the plasma etching work area is also substantially reduced, and the time between cleanings of the plasma etching work area is substantially increased.

The subject invention is directed to a process for etching a semiconductor device to form a predetermined etched pattern therein. The semiconductor device which is provided herein typically has a plurality of layers. At least one of these layers comprises a metal-containing material having a metal content of at least about 80% by weight. Etching the semiconductor device with an etchant material forms a predetermined etched pattern therein. This pattern includes the formation of horizontal and upright sidewalls in the etched layers which comprise the metal-containing material. Thus, each of the upright sidewalls has a profile which is either substantially vertically sloped or is positively sloped. This is the case even though the chemical etchant composition, when employed by itself to etch the above-described metal-containing layers, forms sidewall profiles which are substantially positively sloped configuration.

The etchant material employed herein comprises a chemical etchant composition and a coating composition. The coating composition comprises a gaseous oxide of carbon, particularly carbon monoxide and carbon dioxide, and a silicon-containing compound, respectively. A layer of a coating material produced during the etching operation is deposited onto the vertical walls of the metal layer to form a thin protective film which prevents undercutting of the metal layer. The etchant material is in a substantially gas phase during the etching of the semiconductor device. The silicon-containing compound typically comprises a silicon tetrahalide, preferably comprising $SiCl_4$, $SiBr_4$, or $SiF_4$. However, the most preferred compound being $SiCl_4$.

The foregoing and other objects, features and advantages of the invention will become more readily apparent from the following detailed description of a preferred embodiment which proceeds with reference to the drawings.

DETAILED DESCRIPTION OF A PREFERRED EMBODIMENT

Figure 1:
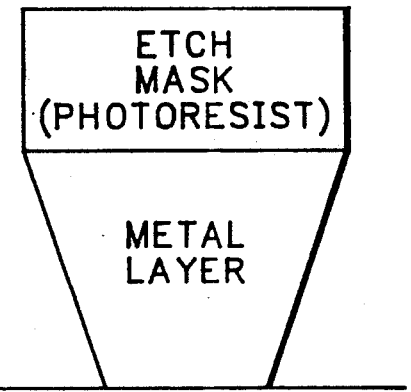
FIG. 1 is a pictorial representation of one form of a prior art semiconductor sidewall profile having a negative slope or retrograde configuration.
Figure 2:
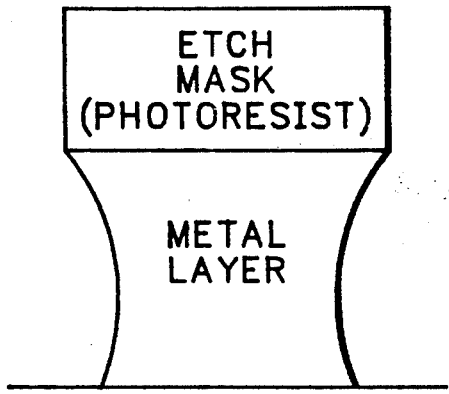
FIG. 2 is a pictorial representation of another form of a prior art semiconductor sidewall profile having a negative slope retrograde configuration.
Figure 3:
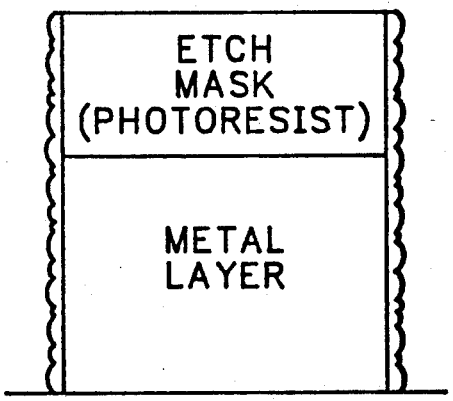
FIG. 3 is a pictorial representation of a semiconductor sidewall profile of the present invention, including a protective layer of a coating material deposited thereon, and having a vertical slope.
Figure 4:
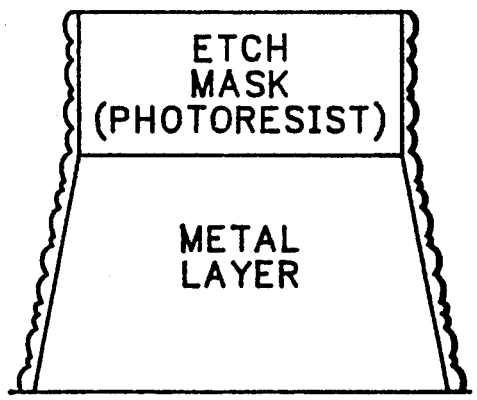
FIG. 4 is a pictorial representation of a semiconductor sidewall profile of the present invention, including a protective layer of a coating material deposited thereon, and having a positive slope.

The inventive process herein is directed to depositing a silicon compound on the metal sidewall of the metal layer during the etching process. Silicon, silicon nitride, $Si_3N_4$ or silicon oxide is formed and deposited from a gaseous silicon phase introduced to the etching gases. Contrary to the prior art deposition methods, the subject process is cleanable and is not toxic. A preferred manner of deposition is by plasma etch deposition. The gas plasma etch technique employed herein typically has an etching area in a plasma and is generated under vacuum within the confines of an RF discharge unit. The preferred plasma etch technique employed herein may include the use of ECR, electro cyclotron resonance, RIE, MIE, PE reactive ion, point plasma etching, magnetically confined PE, or magnetron PE.

A process described in this invention is for etching a semiconductor device to form a predetermined etched pattern therein. The process comprises providing a semiconductor device having a plurality of layers. At least one of these layers of the semiconductor device comprises a metal-containing material having a metal content of at least about 80% by weight of the total weight of the metal-containing layer. Preferably, at least one of the metal-containing layers of the semiconductor has a metal content of at least about 90% by weight.

The semiconductor device located within the etching area is then etched with an etchant material to form a predetermined pattern therein. The etchant material comprises a chemical etchant composition and a coating composition comprising an oxide of carbon, preferably carbon monoxide and carbon dioxide, and a silicon-containing compound, respectively. Preferably, this coating composition is a carbon monoxide or carbon dioxide passivant and a silicon-containing solid passivant, as hereinafter described. The chemical etchant composition and the coating composition are in a substantially gas phase during the etching of the semiconductor device.

The coating material is deposited onto the entire outer surface of the semiconductor, but is removed from the horizontal surfaces by ionic bombardment of the gas phase etchant material. The coating material also protects the upright surfaces from undercutting by the etchant composition. In this way, the etching process can provide for the formation of the upright sidewalls in etched layers comprising the metal-containing material which have a profile which is substantially vertical. And, in situations where the coating material is allowed to accumulate, the upright sidewalls are positively sloped. This is the case in spite of the fact that, when the chemical etchant composition is employed by itself to etch the metal-containing layers as in conventional etching operations, it forms upright sidewall profiles which are substantially positively sloped.

The chemical etchant composition is preferably a halogen-containing material, and typically comprises HCl or chlorine gas. However, the halogen-containing material can also comprise a bromine material selected from the group consisted of HBr and gaseous bromine, or a fluorine material selected from the group consisting of HF, fluorine gas, $SF_6$, $NF_3$. It can also be a fluorinated hydrocarbon such as $CF_4$ and $C2F_6$.

The silicon-containing compound which acts as the solid passivant for profile control can comprise a silicon tetrahalide, preferably $SiCl_4$, $SiBr_4$, or $SiF_4$, $SiCl_4$ being the most preferred.

As for the metal-containing material of the metal-containing layer, it is generally selected from a group consisting of aluminum, molybdenum, titanium, tungsten, copper and aluminum alloys. The aluminum alloys typically include aluminum in combination with any one or all of titanium, tungsten, molybdenum, copper and silicon, and other alloys such as titanium-tungsten alloys.

Having illustrated and described the principles of my invention in a preferred embodiment thereof, it should be readily apparent to those skilled in the art that the invention can be modified in arrangement and detail without departing from such principles. I claim all modifications coming within the spirit and scope of the accompanying claims.

I claim:

1. A process for etching a semiconductor device to form a predetermined etched pattern therein, comprising:

providing a semiconductor device having a plurality of layers, at least one of said layers of said semiconductor device comprising a metal-containing material having a metal content of at least about 80% by weight; and etching said semiconductor device with an etchant material to form a predetermined pattern therein including the formation of horizontal and upright sidewalls in etched layers comprising said metal-containing material, each of said upright sidewalls having a profile which is either substantially vertical or substantially positively sloped;

said etchant material comprising a chemical etchant composition and a coating composition comprising carbon dioxide, and $SiBr_4$, said chemical etchant composition and said coating composition being in a substantially gas phase during said etching of said semiconductor device, said chemical etchant composition when employed by itself to etch said metal-containing layers forming upright sidewall profiles which are substantially negatively sloped.

2. The process of claim 1, wherein said chemical etchant composition is a halogen-containing material.

3. The process of claim 2, wherein said halogen-containing material comprises HCl or chlorine gas.

4. The process of claim 2, wherein said halogen-containing material comprises a fluorine material selected from the group consisting of HF, fluorine gas, $SF_6$, $NF_3$.

5. The process of claim 1, wherein said metal-containing material is selected from a group consisting of aluminum, titanium, tungsten, molybdenum, copper and aluminum alloys comprising aluminum and any one of titanium, tungsten, molybdenum, copper, titanium-tungsten and silicon.

6. The process of claim 1, wherein said metal-containing material has a metal content of at least about 80% by weight.

* * * * *